US008469723B2

(12) United States Patent
Leddy

(10) Patent No.: US 8,469,723 B2
(45) Date of Patent: Jun. 25, 2013

(54) RE-CONFIGURABLE ELECTRICAL CONNECTORS

(75) Inventor: Thomas Leddy, Eastport, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 209 days.

(21) Appl. No.: 13/037,457

(22) Filed: Mar. 1, 2011

(65) Prior Publication Data

US 2012/0225592 A1 Sep. 6, 2012

(51) Int. Cl.
*H01R 12/00* (2006.01)
*H05K 1/00* (2006.01)

(52) U.S. Cl.
USPC ........................................ 439/79; 439/701

(58) Field of Classification Search
USPC ........................................ 439/79, 701, 532
See application file for complete search history.

(56) References Cited

U.S. PATENT DOCUMENTS 4,484,792 A 11/1984 Tengler et al.
4,519,667 A 5/1985 Canning et al.
4,655,518 A * 4/1987 Johnson et al. ................ 439/62
4,662,705 A 5/1987 Prechtl et al.
5,055,069 A * 10/1991 Townsend et al. ........ 439/607.11
5,141,453 A * 8/1992 Fusselman et al. ...... 439/607.11
5,151,036 A * 9/1992 Fusselman et al. ........... 439/108
5,277,624 A * 1/1994 Champion et al. ........ 439/607.13
5,310,354 A * 5/1994 Oswald, Jr. ................... 439/108
5,386,518 A 1/1995 Reagle et al.
5,403,196 A * 4/1995 Northey et al. ............... 439/108
5,554,050 A 9/1996 Marpoe, Jr.
5,613,882 A * 3/1997 Hnatuck et al. ............... 439/686
5,668,419 A 9/1997 Oktay
5,681,175 A 10/1997 Busse et al.
5,795,174 A 8/1998 Saito
5,915,982 A 6/1999 Kashiyama et al.
5,964,602 A 10/1999 Aoki et al.
5,967,806 A * 10/1999 Patterson ...................... 439/108
6,069,992 A 5/2000 Hyzin
6,102,746 A 8/2000 Nania et al.
6,155,850 A 12/2000 Martin et al.

(Continued)

FOREIGN PATENT DOCUMENTS

EP 0731527 A2 9/1996

OTHER PUBLICATIONS

Aldo Bruni, "Latching Mechanism for Plug and Socket Type Electrical Connector", abstract of EP0363804, Apr. 18, 1998.

(Continued)

*Primary Examiner* — Hae Moon Hyeon
(74) *Attorney, Agent, or Firm* — Brian Roffe

(57) ABSTRACT

Re-configurable electrical connector including a pair of endcaps, a pair of elongate rails, each removably attached at one end to one of the endcaps, and connector modules arranged between the endcaps and including one or more male or female connecting members adapted to electrically connect at a first end to one electrical component or part thereof and at a second, opposite end to another electrical component or part thereof. Each connector module includes connecting members adapted to electrically connect at a first end to a first electrical component or part thereof and at a second, opposite end to a second electrical component or part thereof, and a bend between the first and second ends such that a plane in which the first end of the connecting member is situated is not parallel to a plane in which the second end of the connecting member is situated.

20 Claims, 3 Drawing Sheets

U.S. PATENT DOCUMENTS

| | | | |
|---|---|---|---|
| 6,168,445 | B1 | 1/2001 | Seutschniker et al. |
| 6,217,354 | B1 | 4/2001 | Fencl et al. |
| 6,241,539 | B1 | 6/2001 | Sato et al. |
| 6,305,957 | B1 | 10/2001 | Fink et al. |
| 6,345,995 | B1 | 2/2002 | Bigotto et al. |
| 6,354,852 | B2 | 3/2002 | Noro et al. |
| 6,413,105 | B2 | 7/2002 | Noro et al. |
| 6,461,177 | B1 | 10/2002 | Saka et al. |
| 6,464,546 | B2 | 10/2002 | LaCoy |
| 6,824,406 | B1 | 11/2004 | Sharples et al. |
| 6,848,922 | B2 | 2/2005 | Coughlan et al. |
| 6,916,990 | B2 | 7/2005 | Behziz et al. |
| 7,297,031 | B2 | 11/2007 | Leddy |
| 7,326,091 | B2 | 2/2008 | Nania et al. |
| 7,491,066 | B1 | 2/2009 | Chen |
| 7,553,198 | B1 | 6/2009 | Leddy |
| 2007/0128951 | A1 * | 6/2007 | Leddy ........................... 439/701 |

OTHER PUBLICATIONS

International Search Report mailed Jun. 21, 2012 for International Application No. PCT/US2012/027064.

Written Opinion mailed Jun. 21, 2012 for International Application No. PCT/US2012/027064.

* cited by examiner

RE-CONFIGURABLE ELECTRICAL CONNECTORS

CROSS REFERENCE TO RELATED APPLICATIONS

This application is related to U.S. patent application Ser. No. 11/453,660 filed Jun. 15, 2006, now U.S. Pat. No. 7,297,031, and U.S. patent application Ser. No. 11/870,545 filed Oct. 11, 2007, now U.S. Pat. No. 7,553,198, the entire contents of which are incorporated by reference herein.

FIELD OF INVENTION

The present invention relates generally to electrical connectors which connect electrical components together and more particularly to electrical connectors which can be adjusted to provide for different configurations of connecting members so that the connectors can be used with different electrical components.

The present invention also relates generally to electrical connectors that can connect electrical components together at angles to one another, e.g., electrical components having mating connectors perpendicular to one another.

BACKGROUND OF INVENTION

Electrical connectors are needed to connect electrical components together. As used herein, electrical components include cables, wires, patch panels and the like. Each connector is typically provided with a fixed configuration of male or female connecting members which enables it to connect only to an electrical component with the complementary configuration of connecting members. There is therefore no flexibility to use the same connector to connect to two or more electrical components having different configurations of connecting members.

It would be beneficial if a single connector were able to be re-configurable to connect to electrical components having different configurations of connecting members.

OBJECTS AND SUMMARY OF INVENTION

It is an object of the present invention to provide new and improved electrical connectors that connect electrical components together.

In order to achieve this objects and others, an electrical connector for removable attachment to a plurality of different electrical connectors in accordance with the invention includes a plurality of connector modules and a frame defined by first and second endcaps and first and second elongate rails and that can be detached from one another to enable selective insertion and removal of connector modules from the frame defined by the endcaps and rails. The connector modules are separable from the frame and also from one another. Each connector module includes a plurality of connecting members adapted to electrically connect at a first end to a first electrical component or part thereof and at a second, opposite end to a second electrical component or part thereof. Further, each connecting member includes an arcuate bend between the first and second ends such that a plane in which the first end of the connecting member is situated is not parallel to a plane in which the second end of the connecting member is situated. In one embodiment, the bend is a 90 degree bend thereby providing a connector that is mounted to one electrical component or part thereof, e.g., a printed circuit board and provides a mating face perpendicular thereto.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
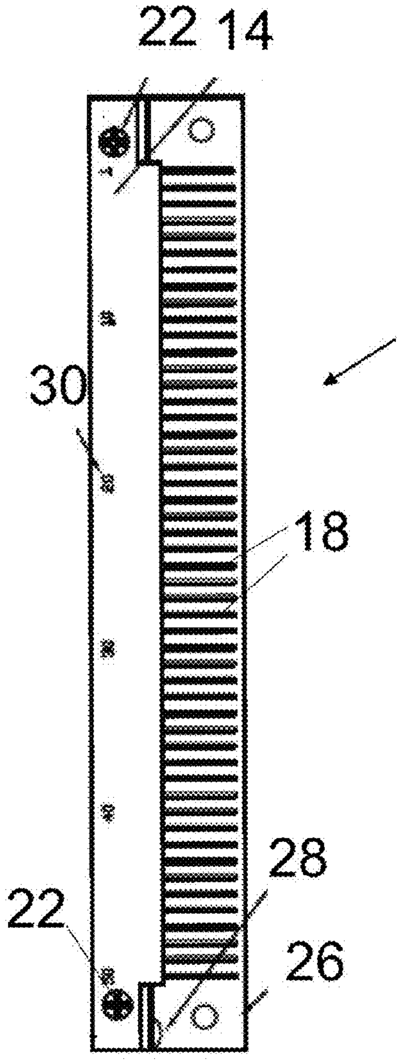
FIG. 1 is a top view of a connector in accordance with the invention.

Referring to the accompanying drawings wherein like reference numerals refer to the same or similar elements, an electrical connector in accordance with the invention is shown in FIGS. 1-4 and is designated generally as 10. Connector 10 includes a frame defined by a pair of endcaps 12 and a pair of elongate rails 14 attached at their ends to the endcaps 12, and a plurality of connector modules 16 arranged between the endcaps 12 and in engagement with the rails 14.

Connector 10 is a male connector in the sense that the connector modules 16 all include only male connecting members, specifically pins 18. Pins can be any known type of pins used in electrical connectors. Pins 18 are held in place by a dielectric housing 20 to form each connector module 16. Thus, at least a part of each pin 18 is fixed in the dielectric housing 20 and electrically isolated thereby from other pins 18. Each pin 18 includes connecting projections each extending from a respective side of the housing 20. Each lateral side of the housing 20 may include a channel in the form of a dovetail groove (see the '198 patent). Each connector module 16 includes six pins 18 but the number of pins may vary as desired.

Figure 2:
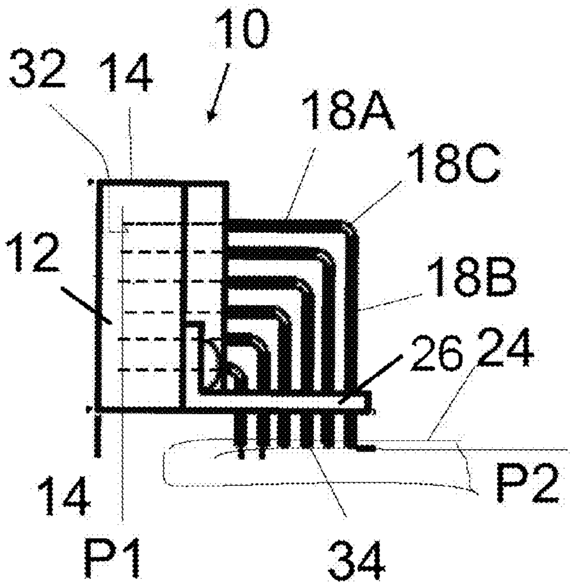
FIG. 2 is a side view of the connector shown in FIG. 1.
Figure 3:
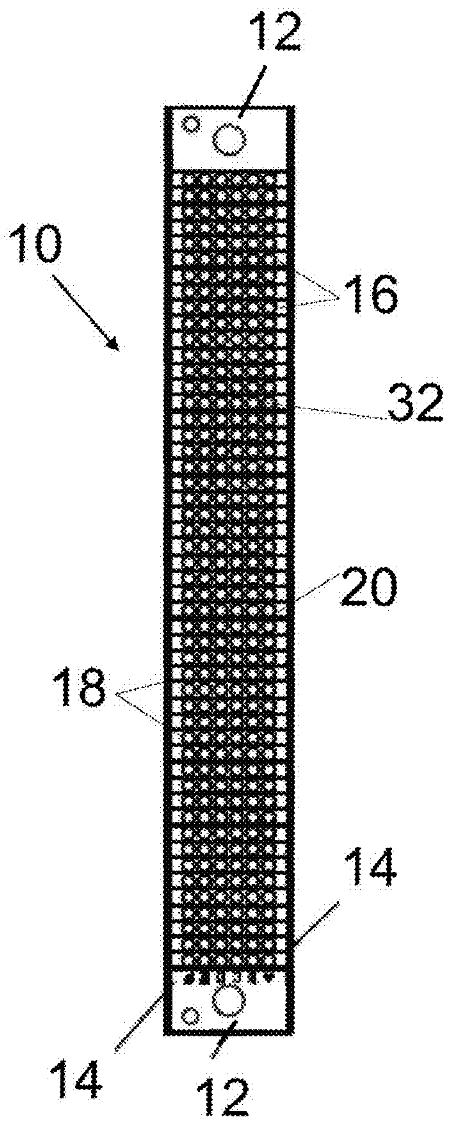
FIG. 3 is a front view of the connector shown in FIG. 1.

Pins 18 are provided with a specific shape to allow the connector 10 to mount at a right angle to a substrate 24 such as a printed circuit board, i.e., perpendicular thereto (see FIG. 2). To this end, each pin has a first straight portion 18A, a second straight portion 18B substantially perpendicular to the first straight portion 18A and a bend 18C between the first and second straight portions 18A, 18B (see FIG. 2). In use, a free end of the straight portion 18B of each pin 18 is attached to the printed circuit board 24, e.g., soldered thereto, and the free end of the straight portion 18A of each pin is removably or fixedly connected to the electrical connector or cable (not shown) that is mating with the connector 10. Connector 10 thereby provides an electrical connection between the electrical connector or cable and the printed circuit board 24.

To provide for this perpendicular configuration, each pin 18 has a different shape than the other pins 18 in the same connector module 16, when each connector module 16 includes only a single column or row of pins 18. The uppermost pin, i.e., that one to be positioned farthest from the printed circuit board 24 has the longest straight portions 18A, 18B, while the lowermost pin, i.e., that one to be positioned closest to the printed circuit board 24 has the shortest straight portions 18A, 18B. Intermediate pins between the lowermost pin and the uppermost pin have straight portions with a size that increases from the lower most pin to the uppermost pin (see FIG. 2).

Figure 4:
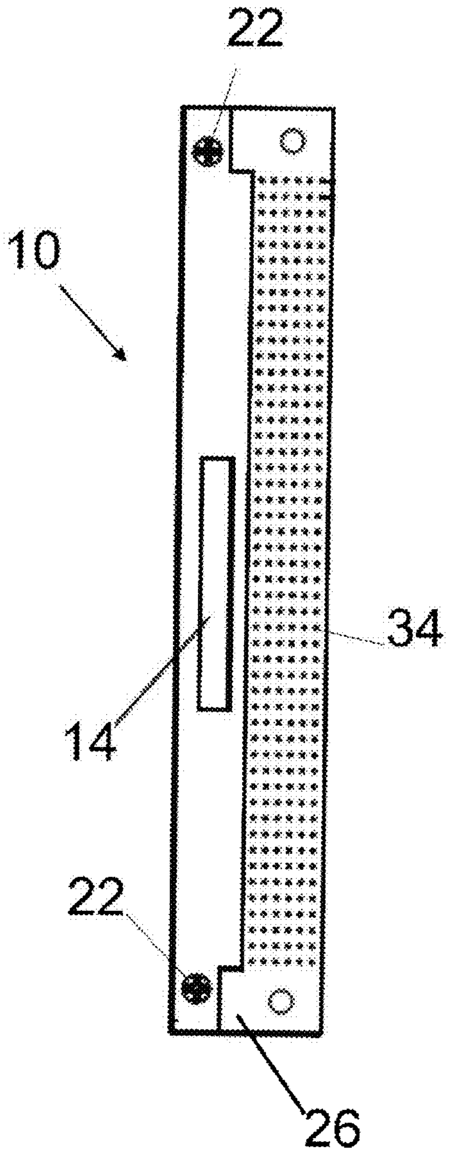
FIG. 4 is a bottom view of the connector shown in FIG. 1.

More generally, each of the pins 18, or other connecting member that may be provided instead of a pin, includes or defines a first end 32 for removably engaging with the first electrical component or part thereof (see FIGS. 2 and 3) and a second end 34 for removably engaging with the second electrical component or part thereof, in this case, the printed circuit board 24 (see FIGS. 2 and 4). Each connecting member further includes a bend 18C between the first and second ends 32, 34 such that a plane P1 in which the first end of the connecting member is situated is not parallel to a plane P2 in which the second end of the connecting member is situated. Rather, plane P1 is perpendicular to P2 in the illustrated embodiment. Of course, the angle between plane P1 and plane P2 may be other than 90 degrees, which is effected by varying the angular nature of the bend 18C.

Moreover, the connector 10 includes a guide plate 26 that is attached by an attachment member, e.g., a screw 28 as shown in FIGS. 1 and 2, to an endcap 12. Guide plate 26 includes a plurality of apertures through which straight portions 18B of the pins 18 pass and are supported thereby. As shown in FIG. 2, the guide plate 26 includes an L-shaped portion having two straight sections, one of which has the apertures through which the straight portions of the pins 18 pass, and the other of which has the aperture through which the screw 28 passes to attach the guide plate 26 to the endcap 12.

Additional details about the endcaps 12 and rails is now provided. However, essentially the same endcaps and rails as are disclosed in the '198 patent may be used herein. Endcaps 12 each have a housing having a front side, a rear side, a top, a bottom and lateral sides. Projections may project from the top. A flange may extend upward at a rear of the housing from the top and has a rear surface contiguous with the rear side. Screw holes are formed in the lateral sides. Lateral sides each include a channel, and an additional, larger channel is formed partially in the lateral side and partially on the side of the flange. Thus, endcaps 12 may have generally the same form as disclosed in the '198 patent.

Rails 14 each include a first projection on an inner side extending along substantially the entire length of the rail 14 and a second projection along the inner side extending along substantially the entire length of a stepped portion of the rail. The second projection may be wider than the first projection, although different relative sizes of these projections can be provided. Thus, rails 14 may have generally the same form as disclosed in the '198 patent.

Apertures are provided proximate the longitudinal ends of the rails 14 and align with the screw holes in the sides of the housing of the endcaps 12. Screws 22 can therefore be inserted through the apertures into the screw holes and tightened to thereby secure the rails 14 at their longitudinal ends to the endcaps 12. Instead of screws, other attachment mechanisms which enable the rails 14 to be selectively attachable to and detachable from the endcaps 12 can be provided in the invention without deviating from the scope and spirit thereof.

The first and second projections have a form, i.e., size and shape, substantially complementary to the form of channels, respectively, on the housing of the endcaps 12. As such, the endcaps 12 can be engaged with the rails 14 by aligning the first and second projections on the rails 14 with the channels, respectively, on the endcaps 12 and sliding them into the respective channel.

Figure 5:
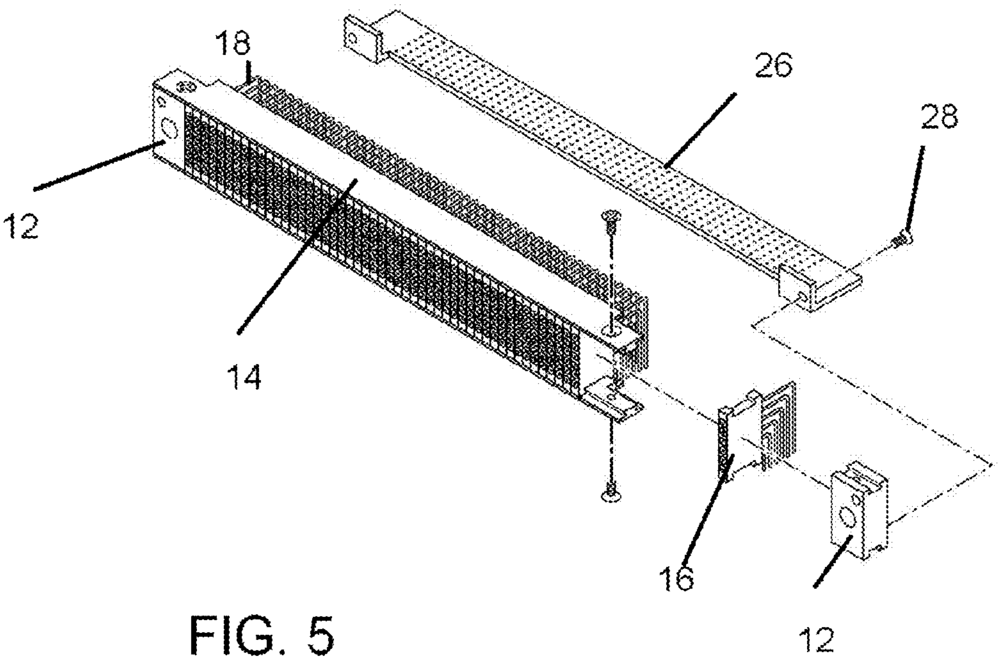
FIG. 5 is a perspective view of the connector shown in FIG. 1.

To assemble connector 10, one end of each rail 14 is attached to one endcap 12, one rail 14 on each side of the endcap 12, by inserting the first and second projections on the rail 14 into the respective channel on the housing of the endcap 12. Screws 22 are then inserted through the apertures into screw holes and tightened. Connector modules 16 are selected for the particular use of the connector 10, e.g., 50 of the connector modules 16 as shown, and each is slid along the rails 14 by aligning the first and second projections on the rails 14 with the channels on the lateral sides of the housing 20. The projections on the rails 14 and channels on the lateral sides of the housings 20 of the connector modules 16 constitute positioning means for movably engaging the connector modules 16 with the first and second rails 14 (see FIG. 5). Indicators 30 may be provided on the rail 14 to provide an indication of the number of connector modules 16. Once the desired connector modules 16 are engaged with the rails 14 attached to one endcap 12, the other endcap 12 is engaged with the rails 14 by aligning the first and second projections with the channels, in the housing of the endcap 12. Screws 22 are then inserted through the apertures into the screw holes in this second endcap 12 and tightened to thereby form connector 10.

By appropriate dimensioning of the rails 14 and selection of connector modules 16, it is possible to provide for a degree of float or play of the connector modules 16 when in the assembled connector 10. Specifically, when using connector module 16, it is useful to be able to slightly slide the connector modules 16 along the rails 14 to ensure proper positioning for mating engagement with other electrical connectors. This ability is thus provided by selection of the dimensions of the components of the connector 10.

If and when it is desired to reconfigure connector 10, one of the endcaps 12 is detached from the rails 14 by loosening the screws 22 and removing them from the screw holes and apertures. The endcap 12 is then slid off of the rails 14 and the connector modules 16 are then also slidable off of the rails 14. The different connector modules 16 sought to be used for the re-configured connector are then placed in engagement with the rails 14 in the desired order and once all of the connector modules 16 are in place, the endcap 12 and rails 14 are re-attached to one another. When reconfiguring the connector 10, it is not required to detach both endcaps 12 from the rails 14 but rather only one of the endcaps 12 needs to be detached from the rails 14 to enable removal and replacement of the connector modules 16.

In the embodiments described above, the combination of the endcaps 12 and rails 14 defines a frame with a plurality of side members, at least one of which is separable from the remaining side members. During use of the connector 10, this separable side member (either of the endcaps 12) is fixed to the other side members (the rails 14 which in turn are fixed to the other one of the endcaps 12) but when it is desired to re-configure the connector 10, this separable side member is detached from the other side members to allow access to the interior of the frame, i.e., to allow the connector modules 16 in the interior of the frame to be removed and replaced as desired. Instead of endcaps 12 and rails 14, other constructions for defining such a frame with an accessible interior are envisioned to be within the scope and spirit of the invention. For example, the frame could be defined by only two side members, namely, a U-shaped side member and an elongate side member which closes the opening of the U-shaped member and is removably attached thereto.

The illustrated connector modules 16 include six pins 18. Alternative connector modules 16 can be used in the invention provided each has the same general form of housing, i.e., a channel on each side which can engage with one of the projections on the rails 14. For example, possible connector modules include one which has a different number of male connecting members, one which has different male connecting members (i.e., different types of pins alongside one another), one which has female connecting members and one which could conceivably have both a male and a female connecting member. In one embodiment, different pins are used depending on the signal intended to be used, i.e., the signal being conveyed through the connector. Of course, whatever configuration is used for one connector must have a complementary configuration in an electrical component to which the connector is to be mated. Typically, the existence of electrical components with known connecting member configurations will determine the manner in which the connector modules will be assembled in a connector in accordance with the invention.

In certain embodiments of the invention, different pins are used depending on the signal intended to be used, i.e., the signal being conveyed through the connector. Of course, whatever configuration is used for one connector must have a complementary configuration in an electrical component to which the connector is to be mated. Typically, the existence of electrical components with known connecting member configurations will determine the manner in which the connector modules will be assembled in a connector in accordance with the invention.

In some connectors in accordance with the invention, there are blank modules which do not contain any connecting members. Such blank modules could serve to position other connecting modules at desired locations intermediate the endcaps 12.

Regarding the material composition of connectors disclosed herein, the rails and endcaps can be made of a metal, such as aircraft-grade aluminum, which provides them with an acceptable level of rigidity for use (which level would be understood or readily determinable by those skilled in the art). The connector modules are preferably made of a material selected based on its electrical properties, such as glass-filled nylon.

The foregoing structure provides new and improved electrical connectors which are adjustable to provide different configurations of connecting members so that the same connectors can be used with electrical components having different configurations of connecting members. Moreover, the foregoing structure provides new and improved electrical connectors which are re-configurable to connect to electrical components having different configurations of connecting members.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. For example, although in the described embodiment, the rails includes two projections and endcaps include two complementary channels, it is possible to form the rails with only one projection in which case, this projection would pass through a single channel formed in the endcap housings and also through the single channel formed in the connector module housings.

The invention claimed is:

1. An electrical connector for removable attachment to a plurality of different electrical connectors, the connector comprising:

a frame defined by first and second elongate rails, a first endcap at one end of said first and second rails and a second endcap at an opposite end of said first and second rails, at least one of said first and second endcaps being removably attached to said first or second rails;

a plurality of connector modules arranged between said first and second endcaps and alongside said first and second rails, said connector modules being separable from one another; and a guide plate attached to at least one of said first and second endcaps, each of said connector modules including a plurality of connecting members adapted to electrically connect at a first end to a first electrical component or part thereof and at a second, opposite end to a second electrical component or part thereof, each of said connecting members including a bend between said first and second ends such that a plane in which said first end of said connecting member is situated is not parallel to a plane in which said second end of said connecting member is situated, said guide plate including apertures through which a portion of each of said connecting members passes.

2. The connector of claim 1, wherein said bend in each of said connecting members is a 90 degree bend such that the plane in which said first end of said connecting members is situated is perpendicular to the plane in which said second end of said connecting members is situated.

3. The connector of claim 1, wherein each of said connecting members includes a first straight portion including said first end and a second straight portion including said second end, said bend being situated between said first and second straight portions.

4. The connector of claim 3, wherein said bend in each of said connecting members is a 90 degree bend such that the plane in which said first end of said connecting member is situated is perpendicular to the plane in which said second end of said connecting member is situated.

5. The connector of claim 1, further comprising positioning means for movably engaging said connector modules with said first and second rails.

6. The connector of claim 5, wherein said positioning means are arranged such that each of said connector modules is movable relative to said first and second rails when said first or second endcap is detached from said first and second rails to enable different configurations of connector modules to be positioned between said first and second endcaps and thereby provide for removable engagement with a plurality of different first electrical components and a plurality of different second electrical components.

7. The connector of claim 1, wherein said plurality of connector modules comprises 50 connector modules and each of said connector modules has 6 pins constituting said connecting members.

8. The connector of claim 1, wherein each of said connector modules further includes a dielectric housing, at least a part of each of said connecting members being fixed in said housing and isolated from other of said connecting members in said housing.

9. The connector of claim 1, wherein each of said connector modules is movable relative to said first and second rails when said first or second endcap is detached from said first and second rails to enable different configurations of connector modules to be positioned between said first and second endcaps and thereby provide for removable engagement with a plurality of different first electrical components and a plurality of different second electrical components.

10. The connector of claim 9, wherein said first and second rails are removably attached at a first end to said first endcap, each of said connector modules being movable relative to said first and second rails when said endcap is detached from said first and second rails.

11. The connector of claim 10, wherein said first and second rails are removably attached at a second end to said second endcap, each of said connector modules being movable relative to said first and second rails when said second endcap is detached from said first and second rails.

12. The connector of claim 1, wherein each of said connector modules further includes a dielectric housing, at least a part of each of said connecting members being fixed in said housing and isolated from other of said connecting members in said housing, each of said connecting members includes a first straight portion including said first end and which is engaged with said housing and a second straight portion including said second end and which is engaged with said guide plate, said bend being situated between said first and second straight portions.

13. The connector of claim 1, wherein said connector modules are movably engaged with said first and second rails.

14. The connector of claim 1, wherein each of said connector modules is movable relative to said first and second rails when said first or second endcap is detached from said first and second rails.

15. The connector of claim 1, further comprising an attachment member that attaches said guide plate to said at least one endcap.

16. The connector of claim 15, wherein said attachment member comprises a screw.

17. The connector of claim 1, wherein said guide plate includes an L-shaped portion having first and second straight sections, said guide plate being attached to said at least one endcap along said first straight section, and said second straight section having the apertures through which the portion of each of said connecting members passes.

18. The connector of claim 17, further comprising an attachment member that attaches said guide plate to said at least one endcap via said first straight section.

19. The connector of claim 18, wherein said attachment member comprises a screw.

20. An electrical connector for removable attachment to a plurality of different electrical connectors, the connector comprising:

a frame defined by first and second elongate rails, a first endcap at one end of said first and second rails and a second endcap at an opposite end of said first and second rails, at least one of said first and second endcaps being removably attached to said first or second rails;

a plurality of connector modules arranged between said first and second endcaps and alongside said first and second rails, said connector modules being separable from one another;

a guide plate; and an attachment member that attaches said guide plate to one of said first and second endcaps, each of said connector modules including a plurality of connecting members adapted to electrically connect at a first end to a first electrical component or part thereof and at a second, opposite end to a second electrical component or part thereof, each of said connecting members including a bend between said first and second ends such that a plane in which said first end of said connecting member is situated is not parallel to a plane in which said second end of said connecting member is situated, each of said connector modules further including a dielectric housing, at least a part of each of said connecting members being fixed in said housing and isolated from other of said connecting members in said housing, each of said connector modules being movable relative to said first and second rails when said first or second endcap is detached from said first and second rails, said guide plate including apertures through which a portion of each of said connecting members passes.

* * * * *